(12) United States Patent
Kuramoto et al.

(10) Patent No.: US 8,701,973 B2
(45) Date of Patent: Apr. 22, 2014

(54) SOLDER BUMP FORMATION ON A CIRCUIT BOARD USING A TRANSFER SHEET

(75) Inventors: Takeo Kuramoto, Atsugi (JP); Kaichi Tsuruta, Tochigi (JP); Takeo Saitou, Mouka (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 161 days.

(21) Appl. No.: 13/138,425

(22) PCT Filed: Feb. 15, 2010

(86) PCT No.: PCT/JP2010/052137
§ 371 (c)(1),
(2), (4) Date: Aug. 12, 2011

(87) PCT Pub. No.: WO2010/093031
PCT Pub. Date: Aug. 19, 2010

(65) Prior Publication Data
US 2011/0297433 A1    Dec. 8, 2011

(30) Foreign Application Priority Data

Feb. 13, 2009   (JP) ................ 2009-031484
Sep. 4, 2009    (JP) ................ 2009-204603

(51) Int. Cl.
B23K 1/20      (2006.01)
B23K 35/24     (2006.01)
H05K 1/09      (2006.01)
B32B 15/04     (2006.01)

(52) U.S. Cl.
USPC ........ 228/245; 228/246; 228/248.1; 228/253; 228/254

(58) Field of Classification Search
USPC ............... 228/245, 246, 248.1, 253, 254
See application file for complete search history.

(56) References Cited

U.S. PATENT DOCUMENTS

| | | | |
|---|---|---|---|
| 4,737,112 A | 4/1988 | Jin et al. | 439/66 |
| 5,591,037 A | 1/1997 | Jin et al. | 439/91 |
| 5,846,366 A | 12/1998 | Jin et al. | 156/233 |
| 5,928,440 A | 7/1999 | Kuramoto et al. | 148/24 |
| 6,000,603 A * | 12/1999 | Koskenmaki et al. | 228/246 |
| 6,095,397 A * | 8/2000 | Wolf et al. | 228/33 |
| 6,454,159 B1 * | 9/2002 | Takushima | 228/253 |
| 2003/0047339 A1 * | 3/2003 | Lutz | 174/52.1 |
| 2005/0045697 A1 * | 3/2005 | Lacap et al. | 228/180.22 |
| 2008/0213613 A1 * | 9/2008 | Tsuruta et al. | 428/577 |

FOREIGN PATENT DOCUMENTS

| | | |
|---|---|---|
| JP | 07336033 | 12/1995 |
| JP | 2001319949 | 11/2001 |
| WO | 2006043377 | 4/2006 |
| WO | 2006067827 | 6/2006 |
| WO | WO 2008105443 A1 * | 9/2008 |

* cited by examiner

Primary Examiner — Devang R Patel
(74) Attorney, Agent, or Firm — Michael Tobias (57) ABSTRACT

A method of forming solder bumps on electrodes of a circuit board without producing bridging using a solder transfer sheet which does not require alignment includes superposing a circuit board and a solder transfer sheet having a solder layer adhered to at least one side of a supporting substrate, performing heating under pressure to a temperature lower than the solidus temperature of the solder to selectively perform solid phase diffusion bonding of the solder layer to electrodes, and peeling the transfer sheet from the circuit board. The solder layer is in the form of a continuous solder coating or in the form of a monoparticle layer of solder particles which are adhered to the supporting substrate by an adhesive layer.

5 Claims, 5 Drawing Sheets

SOLDER BUMP FORMATION ON A CIRCUIT BOARD USING A TRANSFER SHEET

TECHNICAL FIELD

This invention relates to a method of forming solder bumps by selective solid phase diffusion bonding to portions to be soldered of a circuit board using a transfer sheet and to a transfer sheet used in this method.

The term "circuit board" used herein means a substrate on which electronic circuits are installed. It is exemplified by a printed circuit board, but it also encompasses the surface portions having electrodes of various electronic parts such as chip parts which are mounted on a printed circuit board. Electronic parts include active parts such as semiconductor elements, passive parts such as resistors and capacitors, and mechanical parts such as connectors.

Examples of soldering of a circuit board are soldering of electronic parts to a printed circuit board and soldering of the electrodes of electronic parts to each other.

A typical example of a portion to be soldered of a circuit board is an electrode on a circuit board. For example, portions to be soldered of a printed circuit board are portions corresponding to the electrodes of electronic parts or chip elements which are soldered thereto (below, these portions will be referred to as electrodes of a printed circuit board). A portion to be soldered of an electronic part is an electrode of the part itself. In the following explanation, a portion to be soldered will sometimes be referred to as an electrode. However, the wiring of a circuit board can also be a portion to be soldered.

BACKGROUND ART

When mounting an electronic part on a printed circuit board, the electrodes of the electronic part are soldered to the electrodes of the printed circuit board. In this case, it is convenient to employ a method in which solder bumps are previously formed on the electrodes of the printed circuit board and the electrodes of the electronic part are soldered to the solder bumps by reflow soldering.

Formation of solder bumps are most typically performed by printing a solder paste using a mask followed by heating to melt the solder. However, with this printing method, as the number of electrodes on a circuit board increases with the electrodes becoming smaller and the electrode pitch becoming narrower, the yield decreases due to the occurrence of bridging and variation in the amount of solder, unavoidably resulting in an increase in manufacturing costs.

It is known to form solder bumps by a method in which solder balls are mounted on the electrodes of a circuit board using a jig and then the solder balls are melted. However, in this method, minute solder balls having a uniform size and a jig which is fabricated so as to match the electrode pattern on a circuit board are both expensive. In addition, mounting of minute solder balls on prescribed locations using a jig has the problem of poor reliability.

Recently, a number of methods of forming solder bumps using a solder transfer sheet have been proposed.

Below-identified Patent Document 1 proposes a transfer sheet in which depressions formed in a solder resist layer are filled with solder powder. The depressions in the transfer sheet have the same pattern as the portions to be soldered (electrodes) of a circuit board. When the solder transfer sheet is disposed so that the depressions oppose the electrodes of a circuit board and heated under pressure to melt the solder powder, solder bumps are formed on the electrodes of the circuit board. In this method, alignment of the transfer sheet is essential. In addition, because it is necessary to form depressions in the transfer sheet with a prescribed pattern, the manufacturing costs of the transfer sheet are high.

The method proposed in below-identified Patent Document 2 uses a transfer sheet having a supporting substrate on which solder particles adhere to form a monoparticle layer (a layer having the thickness corresponding to one particle) over its entire surface using an adhesive layer. This transfer sheet is disposed so that the solder particle layer faces the electrodes on a circuit board. The surface of the circuit board except locations of the electrodes is previously coated with a solder resist. Next, the circuit board having the transfer sheet mounted thereon is heated under pressure to melt the solder particles. The electrodes are wet by molten solder which adheres thereto, but the solder resist is not wet by molten solder. After the molten solder is solidified by cooling, the transfer sheet is peeled off the circuit board to obtain a circuit board having soldered bumps formed on the electrodes. The solder on the portions opposing the solder resist of the transfer sheet is solidified while adhering to the transfer sheet. The transfer sheet which is used has solder particles adhered to its entire surface, and as it does not have depressions, it can be easily manufactured at a low cost. In addition, the troublesome operation of alignment when disposing the transfer sheet on a circuit board becomes unnecessary.

PRIOR ART DOCUMENTS

Patent Documents

Patent Document 1: WO2006/043377
Patent Document 2: WO2006/067827

SUMMARY OF THE INVENTION

The present inventors confirmed that the transfer sheet described in Patent Document 2 can effectively form solder bumps with little variation on individual electrodes of a circuit board when using solder particles which have been classified to a particle diameter of 5-15 μm if the electrode pitch is 150 μm or larger. However, if the electrode pitch becomes smaller than this size, bridging develops between the electrodes. The cause of bridging is thought to be as follows. When solder particles are melted using a transfer sheet having solder particles adhered over its entire surface, the solder particles are melted not only in the portions which contact electrodes (electrode portions) but also in other portions (non-electrode portions). Therefore, when the electrodes are wet by molten solder, molten solder on the non-electrode portions is also drawn towards the electrodes and the amount of solder on the electrode portions becomes too large, and bridging develops when the electrode pitch is fine.

In order to cope with decreases in the size of electronic equipment, it has been demanded to form solder bumps on electrodes of a circuit board having fine electrodes with an electrode pitch of 50 μm or less. The object of the present invention is to provide a method of forming solder bumps using a transfer sheet which has a solder layer over its entire surface and which does not require alignment, the method capable of forming solder bumps on a circuit board having a fine electrode pitch on the order of 40-50 μm without the occurrence of bridging.

The present inventors found that in the solder bump forming method described in Patent Document 2, if heating is performed to a somewhat lower temperature than the solidus temperature of the solder without melting the solder particle layer, the solder can be selectively bonded to the electrodes of a circuit board by solid phase diffusion bonding, and solder bumps can be formed without the occurrence of bridging even with fine pitch electrodes. They also found that solder bumps can be selectively formed on the electrodes of a circuit board by solid phase diffusion bonding in the same manner by using a transfer sheet having a solder layer in the form of a continuous coating of solder instead of a solder particle layer.

According to a first aspect, the present invention is a method of forming solder bumps on portions to be soldered of a first side of a circuit board, characterized by comprising the following steps (a)-(c):

(a) disposing on the circuit board a solder transfer sheet having a solder layer which is of a size sufficient to cover at least two adjoining portions to be soldered and which is adhered to at least one side of a supporting substrate such that the solder layer of the transfer sheet opposes the first side of the circuit board, wherein the solder layer is selected from a layer formed from a continuous solder coating and a layer formed from a monoparticle layer of solder particles adhered to the supporting substrate through an adhesive layer, (b) heating the circuit board having the transfer sheet disposed thereon which was obtained in step (a) to a temperature lower than the solidus temperature of the solder alloy constituting the solder layer of the transfer sheet while applying pressure so as to cause solid phase diffusion bonding selectively between the portions to be soldered of the circuit board and the solder layer of the transfer sheet, and (c) subsequent to step (b), peeling the transfer sheet and the circuit board from each other and obtaining a circuit board having the solder layer adhered to the portions to be soldered.

The solder layer is preferably of a size sufficient to cover all the portions to be soldered of the circuit board, and the solder is preferably a lead-free solder.

In step (a), if necessary, a flux can be disposed in the interface between the solder layer and the portions to be soldered of the circuit board.

The heating temperature in step (b) is preferably a temperature at least 5° C. lower than the solidus temperature of the solder which is used.

Subsequent to step (c), the method can further include the following step (d):

(d) heating the circuit board obtained in step (c) to a temperature of not lower than the liquidus temperature of the solder alloy to melt the solder layer and then solidifying it.

The solder layer formed from a monoparticle layer of solder particles can be formed by the following method which comprises forming an adhesive layer atop the supporting substrate, dispersing solder particles atop the adhesive layer to form a solder particle layer adhered to the adhesive layer, and removing solder particles which do not adhere to the adhesive layer.

When the solder layer is a continuous solder coating, its thickness is preferably 1-20 μm.

One or both of the following methods can be used to selectively cause solid phase diffusion bonding between the portions to be soldered and the solder layer in step (b).

(1) The portions to be soldered of a circuit board (electrode portions) have a surface of a metal selected from Au and Cu. Au and Cu undergo solid phase diffusion with a tin-based solder alloy, so solid phase diffusion takes place only in portions having a surface of Au or Cu.

(2) The portions of a circuit board other than the portions to be soldered (non-electrode portions) have a surface coated with a solder resist or a surface where a resin is exposed. A solder alloy does not undergo solid phase diffusion with a solder resist or a resin.

According to the present invention, a circuit board is provided which has portions to be soldered and which is characterized in that at least some of the portions to be soldered have a plurality of solder particles which are bonded to the portions to be soldered by solid phase diffusion. Solder bumps are formed on the portions to be soldered by heating the circuit board to a temperature at which the solder particles melt.

From another aspect, the present invention is a solder transfer sheet for carrying out soldering to portions to be soldered of a circuit board by solid phase diffusion bonding, characterized by having a continuous solder coating adhered to at least one side of a supporting substrate, the solder coating being formed from a solder alloy capable of solid phase diffusion bonding with a metal constituting the surface of the portions to be soldered and having a size sufficient to cover at least two adjoining portions to be soldered.

Preferably the continuous solder coating is of a size sufficient to cover all the portions to be soldered of the circuit board and has a thickness of 1-20 μm.

The metal which constitutes the surface of the portions to be soldered is preferably Au or Cu, and the solder alloy is preferably a tin-based lead-free solder alloy.

The continuous solder coating may be formed from any of the following structures:

(1) a foil of a solder alloy which is adhered to the supporting substrate through an adhesive layer, and (2) a plating layer which is deposited on the supporting substrate directly or through a metal thin film.

In the method described in above-mentioned Patent Document 2, a solder transfer sheet having a solder layer formed from a monoparticle layer of solder particles is used and is heated until the solder particles melt, thereby causing the solder to selectively bond to the electrodes using the phenomenon that the electrodes of the circuit board are wet by molten solder. Accordingly, that method can be referred to as a melt transfer method.

In contrast, in the present invention, although a similar solder transfer sheet can be used, the heating temperature is lower than the solidus temperature of the solder so that the solder particles do not melt. Even in this case, the solder particles can be selectively bonded to electrodes by mutual solid phase diffusion between the solder alloy and the metal constituting the surface of the electrodes of the circuit board. Accordingly, the method of the present invention can be referred to as a solid phase diffusion transfer method.

The term "solid phase diffusion" used herein refers to movement of atoms in a solid caused by heat, and in the case of the present invention, it refers to movement of atoms inside the crystal lattice of a metal. Accordingly, solid phase diffusion bonding is bonding based on such solid phase diffusion across the bonding interface.

According to the present invention, using a solder transfer sheet having a uniform solder layer and not having a pattern which matches that of electrodes, it is possible to form solder bumps having a desired shape and height on portions to be soldered (electrode portions) of a circuit board easily and with certainty. Alignment of the solder transfer sheet is not necessary, and a special tools such as a mask used in the printing method or a suction jig used in the solder ball method are not needed. Furthermore, unlike the above-described melt transfer method, transfer of solder takes place in a solid phase, so it is possible to form solder bumps without causing defects such as bridging or unsoldered portions even on circuit boards having fine circuits such as those having an electrode pitch smaller than 150 μm and an electrode diameter smaller than 100 μm. Accordingly, the solid phase diffusion method according to the present invention can be used for mounting of fine electronic parts such as chip parts, CSPs, and BGAs which are becoming increasingly small.

With a circuit board having solder bumps formed by the method according to the present invention on portions to be soldered, when electronic parts are mounted on this circuit board or when the circuit board is mounted on another circuit board, a sufficient amount of solder can be uniformly supplied from the portions to be soldered, so strong solder joints can be formed by reflow soldering.

MODES FOR CARRYING OUT THE INVENTION

First Embodiment

Figure 1:
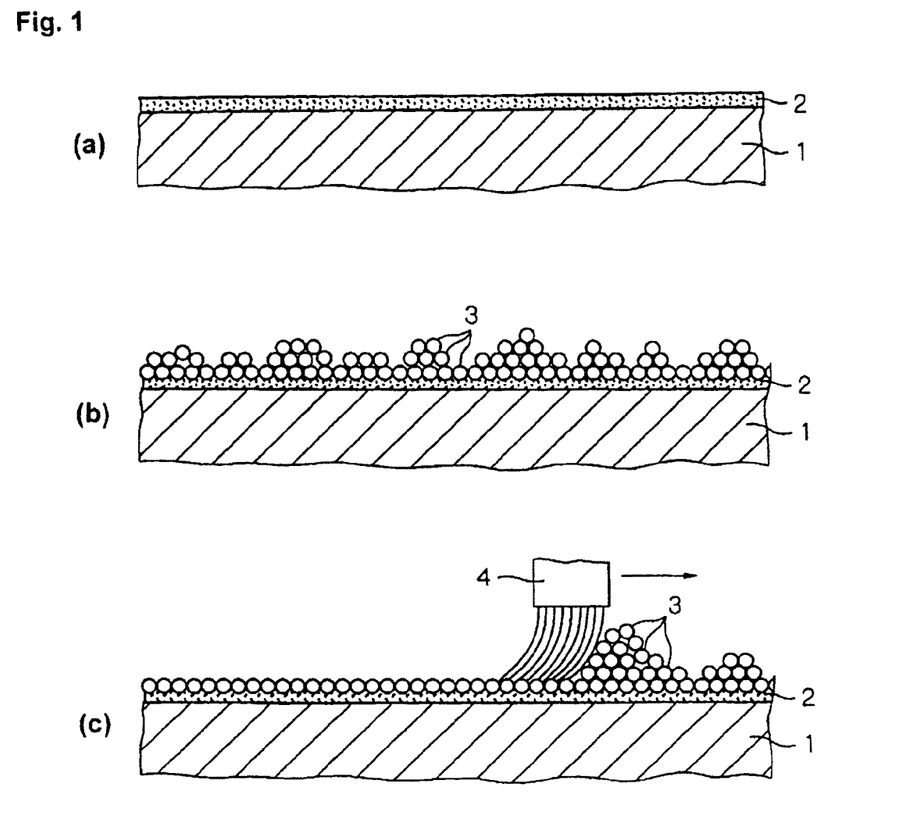
FIGS. 1(a)-1(c) are explanatory views showing steps in a method of manufacturing a solder transfer sheet having a solder particle layer which is employed according to the present invention.

In a first embodiment of the present invention, a solder transfer sheet has a solder layer which is a solder particle layer formed from solder particles distributed in the form of a monoparticle layer. FIGS. 1(a)-1(c) are explanatory views showing a series of steps in a method of manufacturing a solder transfer sheet having a solder particle layer. A method of manufacturing this solder transfer sheet is the same as the method described in above-mentioned Patent Document 2, and it includes a step of forming an adhesive layer atop a supporting substrate (FIG. 1(a)), a step of dispersing solder particles atop the adhesive layer to adhere the solder particle layer to the adhesive layer (FIG. 1(b)), and a step of removing solder particles which are not adhered to the adhesive layer (FIG. 1(c)).

First, an adhesive layer 2 is formed atop a supporting substrate (FIG. 1(a)). The supporting substrate 1 is made from a material to which solder does not readily adhere and which has heat resistance such that it retains its shape even when it is heated to a solid phase diffusion temperature, namely, a temperature which is a few degrees to several tens of degrees lower than the solidus temperature of the solder. The material of the supporting substrate can be a metal such as aluminum or stainless steel, a resin having good heat resistance such as a polyimide, a polyether imide, or a polyester (e.g., polyethylene terephthalate), a composite material such as a glass-epoxy, or a ceramic. The heating temperature of the solder transfer sheet is lower than in the melt transfer method described in above-mentioned Patent Document 2, so the supporting substrate can be selected from a wider range of materials. The thickness of the supporting substrate is typically in the range of 25-200 μm, and accordingly, a material in the form of a film can be used as the supporting substrate. A particularly preferred supporting substrate is a film of a polyester due to its excellent flexibility and particularly a film of polyethylene terephthalate. In this case, a suitable thickness is around 50 μm.

The adhesive layer 2 disposed on the supporting substrate 1 provides the effect of adhering and securing solder particles in the form of a monoparticle layer atop the supporting substrate, and when the transfer sheet is brought into intimate contact with the portions to be soldered of a circuit board under pressure, the adhesive layer serves to plastically deform so as to follow surface irregularities in the surface of the circuit board and causes solder particles to intimately adhere to the portions to be soldered. When the transfer sheet is peeled off after transfer of the solder particle layer to portions to be soldered by heating under pressure has occurred, the adhesive layer must have an adhesive strength sufficient to hold the solder particles on the unsoldered portions which did not undergo solid phase diffusion bonding.

There are no particular limitations on the adhesive as long as it can exhibit the above functions, but preferably it is an adhesive which exhibits adhesion at room temperature or above. For example, at least one adhesive selected from acrylic adhesives, urethane adhesives, polyester adhesives, silicone adhesives, and fluororesin adhesives can be used. Acrylic adhesives are preferable from the standpoints of cost and performance. Silicone adhesives provide excellent performance, but they are expensive.

The adhesion (adhesive strength) of the adhesive layer is preferably in the range of 3-20 N/25 mm when 180° peeling adhesion is measured by the method prescribed in JIS Z 0237. If the adhesion is lower than this range, transfer defects due to a solder layer which did not undergo solid phase diffusion bonding remaining atop the circuit board easily develop when the solder transfer sheet is peeled off after heating for solid phase diffusion. The thickness of the adhesive layer is preferably 10-100 μm and more preferably in the range of 20-50 μm. In a first embodiment, the thickness of the adhesive layer is preferably larger than the average particle diameter of the solder particles.

The adhesive layer 2 can be formed by applying a melt or a solution of an adhesive atop the supporting substrate 1 followed by drying, if necessary. As another method, an adhesive sheet covered with a release film on both sides is provided, the release film on one side is peeled off and the adhesive sheet is adhered to the supporting substrate 1, and then the release film on the other side is peeled off to form the adhesive layer 2. There are also commercially available adhesive sheets or films having an adhesive layer previously applied to one side of a supporting substrate, with the surface of the adhesive layer being protected by a release film. Step (a) can be omitted by using such a commercially available product.

The size of the supporting substrate 1 and the adhesive layer 2 is large enough to cover at least two adjoining portions to be soldered on a circuit board, and preferably large enough to cover all of the portions to be soldered on a circuit board. The supporting substrate 1 may have the same size as the adhesive layer 2, but it may have larger dimensions than the adhesive layer 2 in at least one direction so as to provide a hand grip along at least one side.

The adhesive layer may be divided into a number of blocks atop a large supporting substrate 1. The size of each block is large enough to cover at least two adjoining portions to be soldered and preferably all of the portions to be soldered on the circuit board. When the electrodes of a circuit board are arranged in a block pattern, the adhesive layer may be formed into blocks corresponding to the blocks of electrodes. The transfer sheet may have a supporting substrate in the form of a continuous sheet on which an adhesive layer and a solder particle layer are formed in the shape of blocks, and it can be coiled into a roll and stored. At the time of use, the roll-shaped solder transfer sheet is unrolled and used for bump formation after being cut into individual blocks or without being cut.

Next, solder particles are dispersed atop the adhesive layer 2 formed on the supporting substrate 1, and the solder particles 3 contacting the adhesive layer are distributed on the adhesive layer 2 and adhered thereto preferably with no gaps between them (FIG. 1(b)). As illustrated, an excess of solder particles are preferably dispersed so as to hide the entire adhesive layer. Solder particles which are not adhered to the adhesive layer 2 are then removed to obtain a solder transfer sheet having solder particles adhered to the adhesive layer in the form of a monoparticle layer (FIG. 1(c)). This removal can be performed by lightly brushing with a brush having soft bristles, lightly blowing compressed air, or by turning the supporting substrate upside down and lightly vibrating it. The solder particles which are removed can be reused. The solder particles 3 are preferably distributed as densely as possible on the adhesive layer 2.

The solder particles used to form the solder particle layer are preferably spherical particles, namely, particles referred to as solder balls because they enable the height and shape of solder bumps to be precisely adjusted. However, inexpensive irregularly shaped solder particles can also be bonded to portions to be soldered by solid phase diffusion. Accordingly, there are no particular limitations on the shape of the solder particles as long as a prescribed amount of solder can be supplied to portions to be soldered.

Solder particles used in the present invention are preferably particles of a solder powder which are classified so as to have a particle diameter distribution in a prescribed range such as 5-15 µm. Of course, it is possible to use solder balls having an extremely uniform particle diameter such as solder balls used for BGAs as solder particles, but such solder balls are extremely expensive. In the present invention, a plurality of solder particles (such as at least 10 particles) are present on one electrode, so a certain variation in the particle diameter of the solder particles is permissible. Taking into consideration the variation in the height of the solder bumps which are formed and costs, it is preferable to use solder particles having a particle size distribution of ±40% and more preferably ±30% of the target particle diameter. For example, it is advantageous from a cost standpoint that inexpensively available spherical particles of solder powder obtained by the gas atomizing technique be used after classified with a suitable sieve.

The solder particle layer is in the form of a monoparticle layer of solder particles, and the height of solder bumps which are formed is determined by the thickness of this layer. Accordingly, the larger the average particle diameter of the solder particles, the greater is the height of the solder bumps which are formed. Therefore, the particle diameter of the solder particles is selected in accordance with the height of the solder bumps which it is desired to form and the diameter of the portions to be soldered (electrodes) of a circuit board. Typically, the average particle diameter of solder particles is in the range of 5-50 µm and is at most ½ and preferably at most ⅓ of the electrode diameter. When using irregularly shaped particles, the particle diameter is the diameter of a sphere of equivalent volume.

A solder alloy constituting solder particles is typically a Sn-based solder alloy. However, a solder alloy which is not Sn-based such as an In-based alloy can also undergo solid phase diffusion bonding with Au or Cu, so it may also be used in the present invention. Particles of a typical Sn—Pb eutectic solder alloy which has conventionally been used may also be employed, but it is preferable to use particles of a lead-free solder alloy. Examples of preferred lead-free solder alloys are Sn—Ag based alloys, Sn—Cu based alloys, Sn—Ag—Cu based alloys, and the like. Some typical compositions are as follows (percent is in mass percent):

Sn: remainder, Ag: 0.3%, Cu: 0.5%,
Sn: remainder, Ag: 3.5%, Cu: 0.7%,
Sn: remainder, Ag: 3.5%, and
Sn: remainder, Cu: 0.7%.

Next, a method of forming solder bumps according to the present invention using a solder transfer sheet having a solder layer in the form of a monoparticle layer of solder particles formed in the above-described manner will be explained while referring to FIG. 2 and FIGS. 3(a)-3(c).

Figure 2:
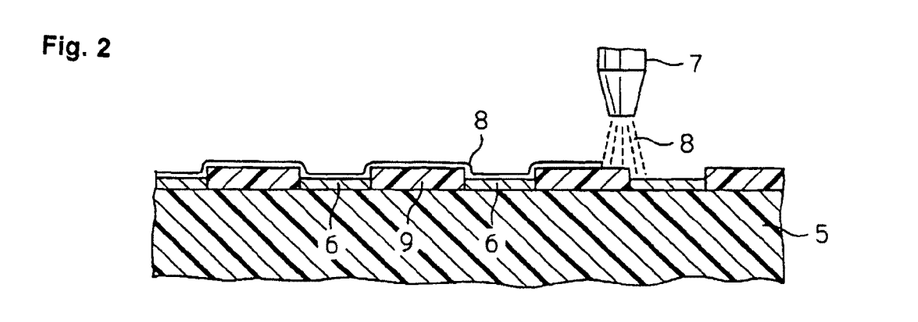
FIG. 2 is an explanatory view showing application of flux to a circuit board.

FIG. 2 is a schematic cross-sectional view of a circuit board 5. The circuit board 5 has a large number of portions to be soldered (electrodes) 5 in a predetermined pattern (such as a plurality of rows and columns with a pitch of 50 µm) on at least one side thereof. The portions to be soldered 5 are electrodes having their surface coated by Au plating, for example, or they are copper electrodes or copper wiring.

The present invention can be used to form solder bumps on a circuit board having electrodes with a diameter of at most 100 µm and an electrode pitch (the center-to-center distance between adjoining electrodes) of at most 150 µm. In particular, it can be used to form solder bumps without the occurrence of bridging even on a fine circuit board with an electrode diameter of 10-50 µm, an electrode pitch of 20-100 µm, and an electrode height of 5-20 µm.

In the illustrated embodiment, the regions of the surface of a circuit board 5 other than the portions to be soldered 6 (the unsoldered portions) are covered by a solder resist 9. The solder resist is formed by a resin which is not wet by molten solder, which can resist soldering temperatures, and which is resistant to flux and cleaning solvents (such as a melamine, epoxy, acrylic, and polyimide resins). Normally, as shown in the drawings, the solder resist 9 is thicker than the portions to be soldered 6, but both may have the same thickness, or the portions to be soldered 6 can be thicker than the solder resist.

Solder resist does not undergo solid phase diffusion bonding with solder. Accordingly, solid phase diffusion bonding can be selectively produced in the portions to be soldered by coating the unsoldered portions of a circuit board with a solder resist. However, even if unsoldered portions are not coated with a solder resist, if the resin or the composite material (such as an epoxy resin or a glass-epoxy composite) which constitutes the substrate of the circuit board is exposed at the unsoldered portions and if the surface of the portions to be soldered is made of Au or Cu, solid phase diffusion bonding can be made to selectively take place in the portions to be soldered because the solder does not undergo solid phase diffusion in the unsoldered portions and Au or Cu easily undergoes solid phase diffusion bonding. Accordingly, coating of the unsoldered portions with solder resist can be omitted.

In the illustrated embodiment, a liquid flux 8 is applied to the surface of the circuit board 5 on which the portions to be soldered 6 are formed using a spray fluxer 7. Then, if necessary, a flux which is applied to the unsoldered portions such as resist 9 on portions other than the portions to be soldered may be removed. The action of flux is to remove an oxide film from bonding surfaces, thereby making it easy for solid phase diffusion bonding to take place. Accordingly, a flux which can produce a fluxing activity under heating conditions for solid phase diffusion can be used (in the present invention, such flux is referred to as a solid phase bonding flux). However, particularly when the surface of the portions to be soldered is made of Au, since Au does not readily form an oxide film, solid phase diffusion bonding can be achieved even if a solid phase bonding flux is not applied if the surface of the solder particles of a transfer sheet can be maintained in an active state by some means. Accordingly, it is not always necessary to apply a solid phase bonding flux. When the surface of the portions to be soldered is made of Cu or when the surface of the solder particles of the transfer sheet has an oxide film, a solid phase bonding flux is preferably applied to at least the portions to be soldered of a circuit board so that this flux is present at the solid phase bonding interface. It is also possible to apply a solid phase bonding flux to the solder layer of a solder transfer sheet instead of to a circuit board, although this operation is more difficult.

Solid phase diffusion bonding is carried out by heating for a short period of time (such as at most 1 minute) at a temperature which is lower than the solidus temperature of the solder alloy which is used. A solid phase bonding flux which can exhibit a fluxing activity under such solid phase diffusion bonding conditions contains an activating agent. Most effective as the activating agent is an organic amine hydrohalide salt. Other effective activating agents include a free organic carboxylic acid and an amine salt of a carboxylic acid. The activating agent is preferably water soluble or soluble in alcohol.

Some specific examples of effective activating agents are as follows. Examples of an organic amine hydrohalide salt are ethylamine hydrobromide, ethylamine hydrochloride, cyclohexylamine hydrobromide, dicyclohexylamine hydrobromide, and alanine hydrobromide. Examples of an organic carboxylic acid are aliphatic carboxylic acids such as formic acid, acetic acid, propionic acid, adipic acid, and sebacic acid, and hydroxycarboxylic acids such as malonic acid, malic acid, glycolic acid, and diglycolic acid. If these carboxylic acids are reacted with an organic amine to form a salt, their water solubility and effectiveness are increased. A wide range of organic amines can be used for this purpose. Some examples are ethylamine, propylamine, butylamine, monoethanol amine, and diethanol amine.

The solid phase bonding flux is prepared by dissolving one or more activating agents and if necessary a surface active agent in a solvent. The surface active agent may be a nonionic surface active agents such as a polyethylene glycol-nonyl phenol ether. A preferred composition of a solid phase bonding flux is at least 0.1 mass % of an activating agent, at least 0.5 mass % of a surface active agent, and a remainder of a solvent. A water-based or alcohol-based solvent can be used as the solvent.

The applied thickness of a solid phase bonding flux varies with the concentration of an activating agent in the flux, but typically it is in the range from several μm to 50 μm. The flux can be applied by the dispenser method which supplies the flux to necessary locations or the spraying method which supplies the flux to the entire surface.

The solid phase bonding flux is preferably present in a necessary amount on portions to be soldered of a circuit board, and the amount thereof is preferably minimized on the surface of unsoldered portions such as the resist surface. As shown in FIG. 2, the portions to be soldered of a circuit board are usually lower than the top surface of a resist coating. Therefore, after application of a flux to the entire surface of a circuit board, flux on the surface of the resist coating can be scraped off onto the portions to be soldered using a rubber blade or the like, so a solid phase bonding flux can be applied only to portions to be soldered even by spraying.

Figure 3:
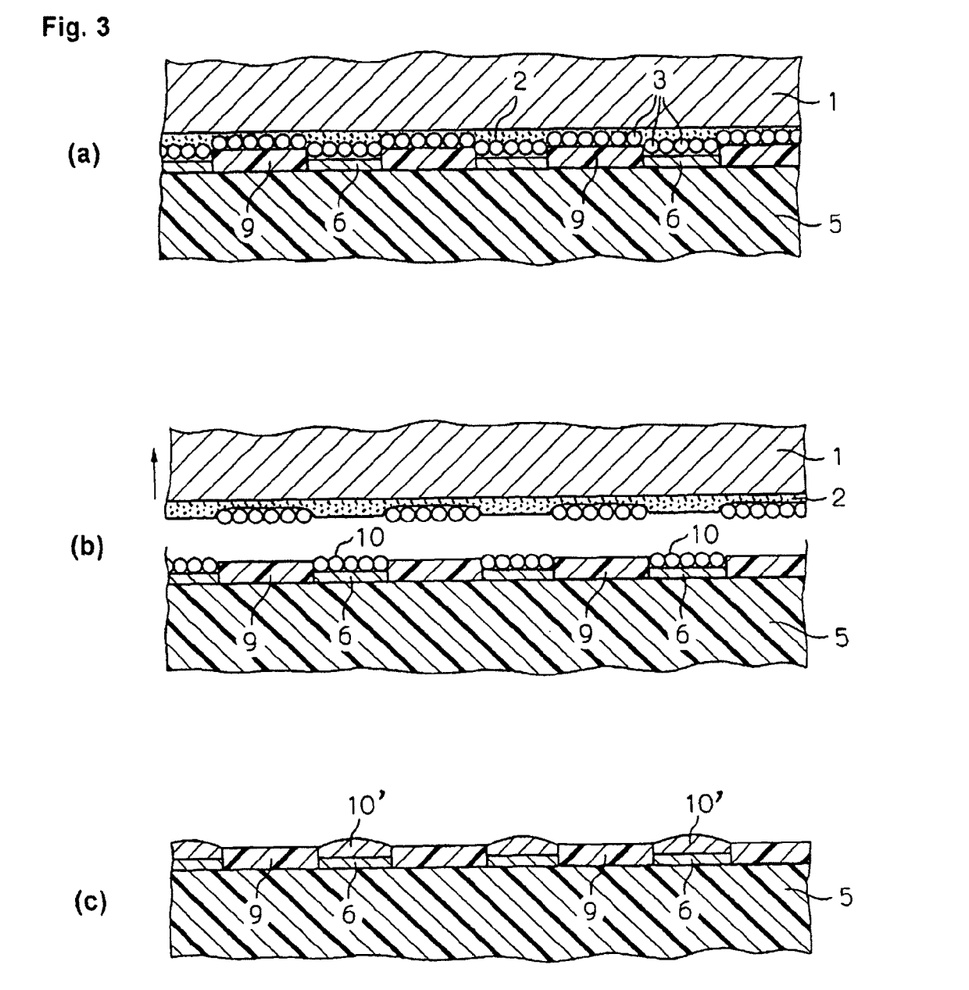
FIGS. 3(a)-3(c) are explanatory views showing steps in a method of forming portions to be soldered using a solder transfer sheet having a solder particle layer.

A solder transfer sheet having a solder layer formed from a monoparticle layer of solder particles 3 adhered to a supporting substrate 1 through an adhesive layer 2 which is shown in FIG. 1(c) is disposed atop a circuit board which is coated with flux or uncoated so that the solder layer opposes the portions to be soldered 6 of the circuit board 5 (FIG. 3(a)). This disposition can be performed such that the solder layer of the solder transfer sheet covers the portions to be soldered where it is desired to form solder bumps on the circuit board and preferably covers all of the portions to be soldered, with precise positioning being unnecessary. As the reverse of the illustrated state, the circuit board may be disposed on top.

Pressure is then applied to the stacked solder transfer sheet and circuit board and heating is performed under pressure, thereby causing solid phase diffusion bonds to take place selectively between the portions to be soldered of the circuit board and the solder layer of the transfer sheet.

The mechanism of solid phase diffusion bonding will be explained taking bonding between an electrode (a portion to be soldered) and a solder ball (a solder particle) as an example. When a solder ball is sufficiently close to an electrode while the surfaces of the electrode and the solder ball are in an active state without the presence of oxides and the like, a portion of the atoms of the constituent elements of the solder ball migrate into the metal of the electrode, and/or a portion of the atoms of the constituent elements of the electrode migrate into the metal of the solder ball, and migration of the atoms of the constituent elements of one or both of the two contacting bodies across the bonding interface takes place to achieve solid phase bonding. As this solid phase bonding progresses, the bonding strength between the solder ball and the electrode increases. Solid phase diffusion is promoted by heating the bonding surface. Energy is required for atoms to be diffused across the bonding interface. In the present invention, the energy is supplied by heating. An extremely long time is required for solid phase diffusion when pressure is simply applied at room temperature.

The heating temperature for solid phase diffusion bonding is lower than the solidus temperature of the solder alloy which constitutes the solder particles, and preferably it is at least 5° C. lower and more preferably at least 10° C. lower than the solidus temperature. There is no particular lower limit on the heating temperature as long as solid phase diffusion bonding can take place. In general, the speed of solid phase diffusion markedly decreases at a temperature at or below 60% of the solidus temperature (° C.), so the lower limit on the heating temperature is made at least 60%, preferably at least 70%, and more preferably at least 80% of the solidus temperature. Accordingly, when the solidus temperature of the solder alloy is around 220° C., the heating temperature is preferably 155-215° C. and more preferably 175-210° C. When the solder particles are constituted by a low temperature solder having a solidus temperature of around 160° C., the heating temperature is preferably 112-155° C. and more preferably 130-150° C. The necessary heating temperature also varies with the activity of the solid phase bonding flux which is used.

If the heating temperature is too low, the bonding strength of the solder layer to the portions to be soldered becomes weak and transfer of the solder becomes unstable. On the other hand, if the heating temperature is too high, it becomes too close to the melting point, and it sometimes becomes difficult to accurately perform selective transfer of the solder. It is necessary to control the heating temperature, so heating is carried out using a heating apparatus which can accurately control the temperature while applying pressure. Heat and pressure can be applied from either the circuit board or the transfer sheet, or it can be applied from both.

As shown in FIG. 3(a), as a result of pressure, the adhesive layer 2 of the transfer sheet undergoes plastic flow, and the solder particles 3 come into contact with the opposing portions to be soldered 6 or solder resist 9 of the circuit board 5. The necessary pressure depends upon factors such as the surface shape of the circuit board and the properties of the adhesive layer, but a suitable pressure for obtaining a good contact accuracy is 0.01-1.0 N/mm$^2$. In the absence of a suitable pressure, solder particles cannot be made to contact the portions to be soldered.

As a result of this heating under pressure, the solder particles which contact the portions to be soldered of the circuit board produce mutual solid phase diffusion with the portions to be soldered at the contact interface while being maintained as solid particles without melting, and the solder particles and the portions to be soldered are bonded to each other in the contact interface. The time required for this solid phase diffusion bonding varies with the heating temperature and the surface condition of the interface, but typically it is at most 1 minute. A preferred heating temperature is 30-60 seconds.

In order to promote diffusion of atoms occurring across the bonding interface, it is necessary for the interface to be active. When an oxide film or the like is present on the interface, the interface can be activated at the time of heating by providing the above-described solid phase bonding flux on the interface.

Solid phase diffusion bonding is a technology which has been put to practical use as a type of welding. In welding, the heating atmosphere is a controlled atmosphere such as a vacuum or an inert gas atmosphere. In the present invention, a high bonding strength like that achieved in welding is not necessary, and the bonding strength by solid phase diffusion bonding between the portions to be soldered and the solder particle layer need only be higher than the bonding strength between the adhesive layer and the solid particle layer. Therefore, as long as the bonding interface is activated, the heating atmosphere can be air. Of course, if costs are not a consideration, a vacuum or an inert gas atmosphere can be used, thereby making it possible to greatly shorten the heating time required for solid phase diffusion bonding, and in this case, application of a solid phase bonding flux can be made unnecessary.

Even if solder particles which are adhered to portions to be soldered by solid phase diffusion bonding in this manner are subsequently melted, the chances for the occurrence of bridging are greatly decreased since the solder particles are not present in regions other than the portions to be soldered. This effect is obtained regardless of the size of the solder particles as long as solid phase diffusion bonding is employed. Therefore, even if comparatively large solder particles such as those having a size of up to around 10 μm are used, it is possible to form solder bumps on electrodes with a pitch of 50 μm without the occurrence of bridging.

After solder particles are bonded to portions to be soldered of a circuit board by solid phase diffusion bonding, the superposed circuit board and transfer sheet are immediately cooled, and the transfer sheet is peeled from the circuit board. Cooling can be carried out by simply removing the superposed members from a heating apparatus and allowing them to cool, but it is also possible to blow cold air. Peeling can be performed by simply pulling the transfer sheet from the circuit board. As a result, the solder particles bonded to the portions to be soldered of the circuit board by solid phase diffusion remain atop the portions to be soldered and become solder bumps 10 in a particulate form, and the remaining solder particles are peeled off the circuit board while still adhering to the transfer sheet (see FIG. 3(b)). In this manner, selective transfer of solder particles to portions to be soldered of a circuit board is achieved.

Solder particles which are selectively transferred to portions to be soldered of a circuit board by solid phase diffusion bonding can achieve soldering of an electronic part to the circuit board by applying a flux if necessary and then placing electronic parts to be soldered atop the circuit board and subjecting to reflow heating. Accordingly, solder particles which are bonded to portions to be soldered of a circuit board function as solder bumps 10 even when remaining in a particulate form.

If desired, a circuit board having solder particles which are bonded atop portions to be soldered by solid phase diffusion can be heated to at least the liquidus temperature of the solder alloy constituting the solder particles to melt (reflow) the solder particles, thereby causing the solder particles to cohere and, as shown in FIG. 3(c), form solder bumps 10' with its center being raised and rounded by the action of surface tension on the portions to be soldered of a circuit board. As a result, the reliability of bonding of solder bumps to portions to be soldered of a circuit board is increased. When solder particles which have undergone solid phase diffusion bonding remain in a particulate state, a portion of the solder particles may fall off when a strong impact is applied to the circuit board. Reflow of the solder particles can prevent them from falling off in this manner. Accordingly, the ease of handling of a circuit board is improved by reflow of solder particles.

When carrying out reflow of the solder particles, a flux for reflow soldering is preferably applied to the entire circuit board or to the portions thereof to be soldered (namely, the solder bumps) prior to heating. After reflow, the circuit board which was cooled is preferably washed to remove flux residue. The flux which is used can be one which is conventionally used in reflow soldering. Washing can be carried out in accordance with the flux which was used, such as by using warm water for a water-soluble flux or using an organic solvent such as alcohol for a resin-based flux. The heating conditions can be the same as for usual reflow soldering. For example, heating can be carried out by heating for around 1-30 seconds at a temperature of 5-40° C. above the liquidus temperature of the solder alloy.

In a method of forming solder bumps according to the present invention, the thickness of the solder bumps which are formed can be accurately controlled. This is because there is little variation in the amount of solder particles per unit area which are adhered to the adhesive layer of the solder transfer sheet. When a transfer sheet and a circuit board are superposed and pressure is applied, the solder particles on the transfer sheet contact the portions to be soldered of the circuit board, so while the solder particles undergo solid phase diffusion bonding, a constant amount of solder particles contact the portions to be soldered, and the accuracy of the bump thickness is improved. Solder particles which contact the solder resist surface (not the portions to be soldered) also undergo solid phase diffusion bonding between solder particles contacting in the horizontal direction, but the bonding strength between solder particles is thought to be weaker than the bonding strength due to solid phase diffusion bonding with electrodes (portions to be soldered).

Transfer is completed by peeling the transfer sheet from the circuit board, with solder particles which were bonded to the portions to be soldered of the circuit board by solid phase diffusion remaining on the circuit board. The amount of solder particles which are transferred is nearly constant, so bridging does not readily take place even when portions to be soldered have an extremely fine pattern.

Second Embodiment

In a second embodiment of the present invention, a solder transfer sheet has a solder layer in the form of a continuous coating of a solder alloy. Below, the second embodiment of the present invention in which a solder layer is a continuous coating will be explained for the case in which the portions to be soldered of a circuit board have a surface made of Au. However, the portions to be soldered may have a surface of a metal or alloy other than Au such as Cu. In this case, an oxide film is present on the surface of the portions to be soldered, so the oxide film can be previously removed prior to bonding, or the above-described solid phase bonding flux can be provided at the bonding interface.

Electrodes of a circuit board which are soldered using a lead-free solder often have an Au plating layer provided atop an underlying Ni plating layer, so the surface of the electrodes is made of metallic Au. This type of electrode will be referred to below simply as an Au-plated electrode. As the speed of diffusion of Au into Sn is extremely high, soldering to Au-plated electrodes can easily be carried out even with an Sn-based lead-free solder having poorer solderability compared to a Pb—Sn eutectic solder.

Rapid diffusion of Au into Sn takes place even in a solid phase, so diffusion of Au into Sn can also be utilized with solder bump formation according to the present invention which employs solid phase diffusion bonding. Namely, if the Sn-based solder layer of a solder transfer sheet and the Au-plated electrode surface of a circuit board are heated under pressure to a temperature lower than the solidus temperature of the solder alloy constituting the solder layer, the Au on the surface of the electrodes rapidly diffuses into the Sn-based solder layer, solid phase diffusion bonding takes place between the solder layer and the electrode surface, and the solder layer is strongly adhered to the electrode surface. When the transfer sheet is peeled off the circuit board after cooling, just the portions of the solder layer which underwent solid phase diffusion bonding selectively remain on the electrode surface, and the other portions of the solder layer separate from the circuit board while adhering to the transfer sheet.

Due to an increased bonding strength (adhesion) between the solder layer and the Au-plated electrodes achieved by solid phase diffusion, even when the solder layer is a continuous solder coating, selective transfer of the solder layer only to the electrodes of a circuit board takes place, to which the following mechanism is thought to contribute.

First, when the surface of Au electrodes and a solder coating are intimately contacted and heated under pressure, due to the above-described solid phase diffusion (movement of atoms across the bonding interface), an intermetallic compound of Au and Sn is formed. Solder which contains such an intermetallic compound has a lower melting point than the original solder. Therefore, even if heating is performed at a lower temperature than the solidus temperature of the solder alloy, bonding between the electrodes and the solder coating takes place through the intermetallic compound formed by solid phase diffusion.

When the surface of the electrodes is made of Cu, since Sn and Cu easily form an intermetallic compound, it is conjectured that bonding takes place by the same mechanism as described above. In this case, in order to promote solid phase diffusion of Sn and Cu, it is effective to provide the previously-described solid phase bonding flux at the bonding interface or remove an oxide film from the surface of the electrodes before bonding.

The surface of a circuit board having electrodes is usually not flat and there is a difference in height between the electrodes and non-electrode portions. When the transfer sheet is peeled off the circuit board after heating under pressure, due to this difference in height, the solder coating is subjected to a shear stress in the thickness direction at the border contacting the electrodes. Namely, compared to a flat circuit board in which electrodes and non-electrode portions have the same height, the solder coating more easily and accurately separates in the thickness direction by shearing force at the border between the non-electrode portions and the electrodes, and the solder layer is selectively transferred to electrodes.

As the thickness of Au plating increases, the amount of diffusion of Au in the thickness direction (the height direction) of a solder coating increases, and it becomes possible to transfer a thicker solder coating. The plating thickness of Au plating formed by usual flash plating is on the order of 0.03-0.05 μm. In this case, the thickness of a solder coating which can be accurately selectively transferred to Au plated electrodes is approximately 10-15 μm.

Figure 4:
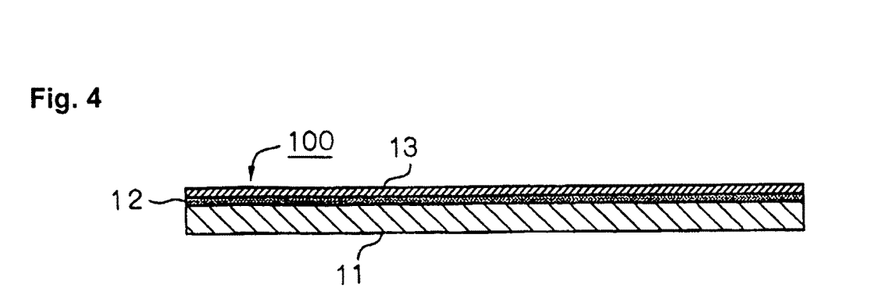
FIG. 4 is a schematic cross-sectional view of a solder transfer sheet having a continuous solder coating which is employed according to the present invention.

FIG. 4 is a schematic view showing the structure of one example of a solder transfer sheet 100 used in the second embodiment of the present invention. This solder transfer sheet 100 has a solder coating 13 adhered atop the entire surface of a supporting substrate 11 in the form of a film through an adhesive layer 12. As described above, it is also possible to form a solder coating adhered to a supporting substrate without using an adhesive layer.

The materials used for the supporting substrate, the solder, and the adhesive when manufacturing this solder transfer sheet can be the same as those explained with respect to the first embodiment. The adhesive layer is made of a material exhibiting an adhesive strength which can adhere the solder coating to the non-electrode portions when the solder transfer sheet is peeled off after the solder layer is selectively bonded to electrodes of the circuit board by solid phase diffusion. The necessary adhesive strength is as explained with respect to the first embodiment. In the second embodiment as well, the thickness of the adhesive layer is preferably in the range of 10-100 μm and more preferably in the range of 20-50 μm.

There are no particular limitations on the shape and size of the solder transfer sheet 100 itself. Advantageously, it is a continuous sheet with a width of around 10-350 mm which is coiled into a roll and then unrolled when used. However, a rectangular shape such as one having a length of 10-350 mm and a width of 10-350 mm can also be used. According to the present invention, precise alignment is not necessary at the time of solder transfer, so the shape and size of the transfer sheet can be suitably selected in accordance with conditions of use.

The solder coating 12 includes at least one flat continuous solder coating, and it may include two or more continuous solder coatings. The size of each continuous solder coating is large enough to cover at least two adjoining portions to be soldered (electrodes) on the circuit board, and preferably it is a size sufficient to cover all of the portions to be soldered on a circuit board.

In the illustrated example, the solder coating 13 is provided over the entire surface of the supporting substrate 11, but it is also possible to divide it into block-shaped areas. Preferably, each block of the solder coating is roughly equal to the size of the circuit board so that solder bumps can be formed on all of the electrodes of one circuit board using one block. In the case of a roll-shaped solder transfer sheet, blocks of the solder coating are disposed with a suitable spacing in the lengthwise direction of the roll.

The thickness of the solder coating directly affects the height of solder bumps which are formed. Accordingly, the thickness of the solder coating is selected in accordance with the height of solder bumps to be formed. For example, when it is desired to form solder bumps with a height of 10-15 μm on electrodes with a diameter of 25 μm and a pitch of 50 μm, a suitable thickness of the solder coating is approximately 10-15 μm. In the case of a solder bump height of 5 μm on electrodes with a pitch of 25 μm and a diameter of 12 μm, a suitable solder coating thickness is approximately 5 μm.

In general, a preferred thickness for the solder coating is in the range of 1-20 μm. If the solder coating is too thick, even if solid phase diffusion bonding takes place with the surface of electrodes, it is no longer possible to separate the solder coating from the non-diffusion regions in the periphery of electrodes (the regions where solid phase diffusion bonding with the solder coating does not take place) by shearing force. It is desirable for the thickness of the solder coating to be as uniform as possible from the standpoint of suppressing variations in the height of solder bumps which are formed.

Methods of adhering a solder coating 13 atop a supporting substrate 11 include the following:

A: a method in which a solder foil formed by rolling or the like is bonded to a supporting substrate by an adhesive, and B: a method in which a solder coating adhering to a supporting substrate is formed without using an adhesive by techniques such as plating, application of a solder paste followed by reflow heating, sputtering, and ink jet application. Each of these techniques is known to those skilled in the art, and it can be carried out in the conventional manner. For example, methods of forming a block-shaped solder coating (such as by using a mask) are well known.

In method B, it is preferable to adhere a solder coating to a substrate through a metal film which has poor wettability by molten solder but can hold a solder coating without interfering with peeling of the sheet. This is because if the solder coating is formed directly on the supporting substrate, the adhesion of the solder coating may be too strong, and it may be difficult to transfer the solder coating to portions to be soldered when the transfer sheet is peeled off. An example of such a metal film is an Al film with a thickness of around 1 μm which is provided on the supporting substrate by vapor deposition or the like. However, when the supporting substrate is made of a material which is inherently difficult to wet by molten solder, a metal film is not needed.

A solder transfer sheet formed by method A is easy to handle and transfer is easy to carry out. In addition, method A can be used with all solder alloys regardless of their composition.

Among the techniques of forming a solder coating listed with respect to method B, plating has limitations with respect to the composition of a solder alloy which can be employed. However, if the composition is one which is capable of being plated, plating has the advantage that a solder coating can be easily formed. Plating can be carried out by electroplating, electroless plating, or vapor deposition plating.

In a technique comprising application of solder paste followed by reflow heating, the solder paste is applied atop a supporting substrate which has been coated with a metal film, and then the solder paste is melted to form a solder coating. This technique is not suited for forming a solder coating with a large area because there are increased variations in the coating thickness.

Next, a method of forming solder bumps using a solder transfer sheet having a solder layer in the form of a continuous solder coating according to the present invention will be explained.

Figure 5:
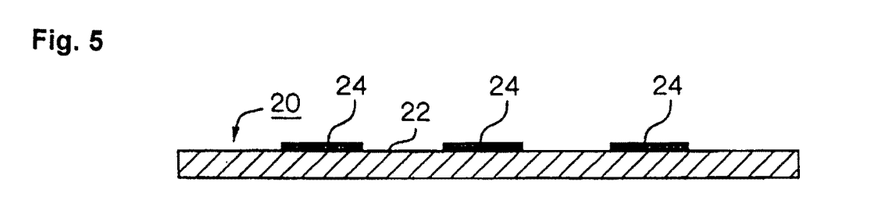
FIG. 5 is a schematic cross-sectional view of one example of a circuit board having portions to be soldered on which solder bumps are formed.

FIG. 5 is an explanatory view schematically showing one example of a circuit board having electrodes on which solder bumps are to be formed. The circuit board 20 has a large number of electrodes (portions to be soldered) 24 arranged in a predetermined pattern on one side of a substrate 22. The electrodes 24 have Ni plating as a lower layer and Au plating as an upper layer atop Cu electrodes, with the surface of the electrodes being made of Au. The illustrated circuit board has a substrate (made of glass-epoxy, for example) exposed in the spaces between electrodes, but these portions may be coated with a solder resist as shown in FIG. 2.

Figure 6:
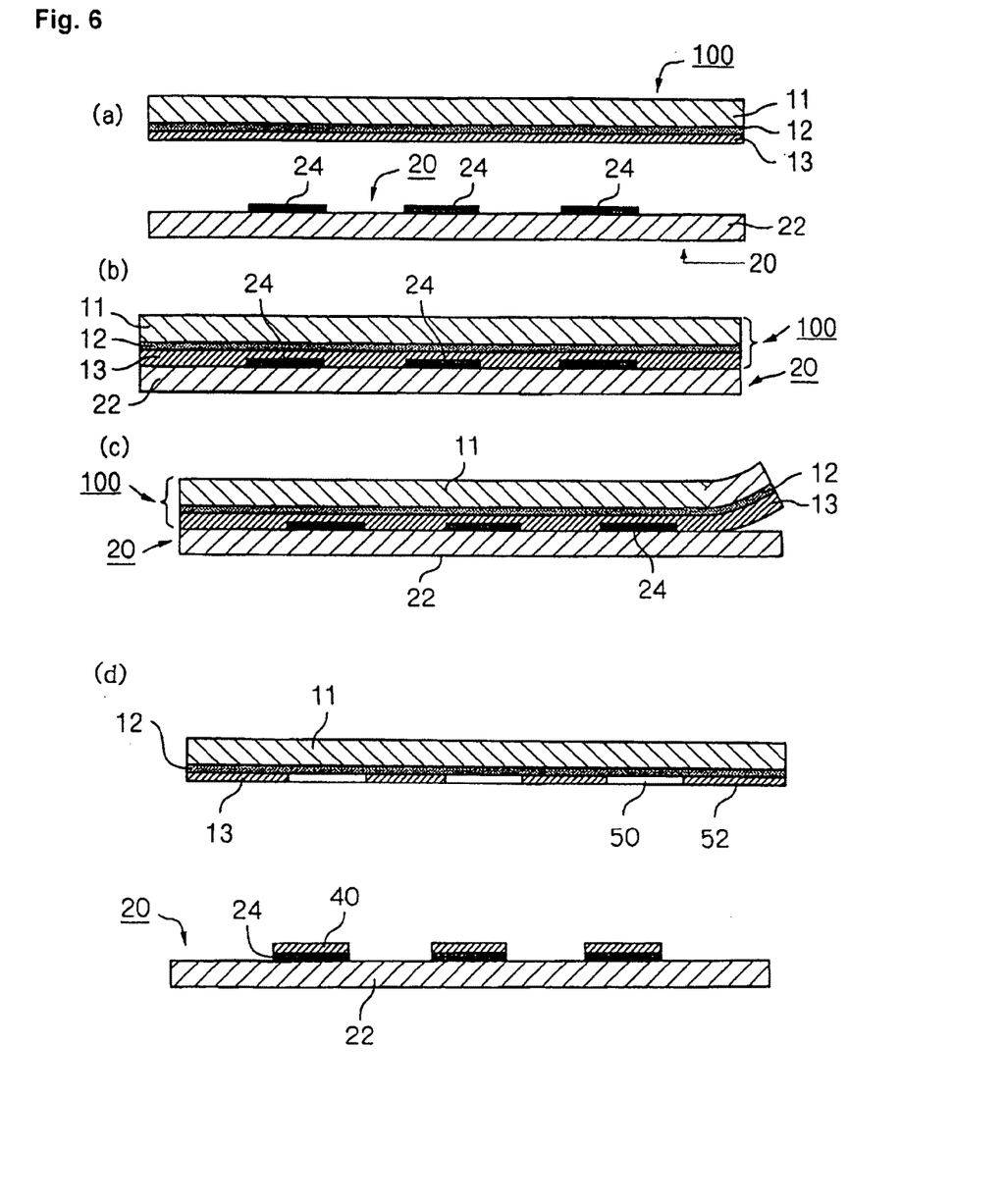
FIGS. 6(a)-6(d) are schematic views showing a series of steps in a method of forming solder bumps according to the present invention.

In order to form solder bumps atop the electrodes 24 of the circuit board 20, first, as shown in FIG. 6(a), a solder transfer sheet 100 having a continuous solder coating 13 (FIG. 4) and a circuit board 20 (FIG. 5) are superposed such that the solder coating 13 of the transfer sheet 100 opposes the electrodes 24 of the circuit board 20. Either the circuit board or the transfer sheet can be on top. The solder coating is preferably a continuous coating having a size such as to cover all of the electrodes of the circuit board, so the transfer sheet can be disposed without being aligned. It is sufficient to place the transfer sheet atop the circuit board so as to cover all of the electrodes. In this manner, the entire circuit board is covered by the solder coating (see FIG. 6(b)). When the solder coating is divided into blocks, alignment of the blocks with respect to each other is necessary, but this alignment is easier than alignment of a conventional mask with respect to each of the electrodes because the dimensions of blocks are much larger than electrodes.

Preferably the solder coating on the transfer sheet is previously subjected to treatment for removing an oxide film. This can be carried out easily by, for example, acid treatment using an acid solution such as a solution of butane-tetracarboxylic acid in an alcohol. Acid treatment can be carried out by immersion or application at room temperature with a duration of treatment of approximately 30 seconds to 1 minute. Acid treatment is followed by washing with water and drying. It is also possible to remove an oxide film by dry treatment such as heat treatment in a reducing atmosphere, plasma treatment, or laser treatment. If the electrode surface is Au, removing an oxide film from the transfer sheet makes it possible to achieve solid phase diffusion bonding without application of a solid phase bonding flux.

A pressure is applied to the circuit board 20 on which the solder transfer sheet 100 is disposed, and heating is carried out at a temperature which is sufficient to achieve solid phase diffusion bonding between the solder coating and the electrode surface (Au plating layer) in a short period and which is lower than the solidus temperature of the solder alloy constituting the solder coating. Pressure can be applied from one or both sides of the circuit board and the transfer sheet by a press, for example, so that the solder coating contacts the electrodes with certainty. The pressing and heating conditions can be the same as explained with respect to the first embodiment.

Solid phase diffusion between the solder alloy in the solder coating and the Au plating layer of the electrode surface by heating under pressure causes the solder coating to bond to the electrode surface. The bonding strength obtained by this solid phase diffusion bonding must be greater than the bonding strength between the solder coating and the adhesive layer (when there is no adhesive layer, it must be greater than the bonding strength between the solder coating and the metal film provided atop the supporting substrate). In the region outside the electrodes of the circuit board (the non-electrode portions), the substrate 11 of the circuit board (or the solder resist 9 in the case of the circuit board shown in FIG. 2) contacts the solder coating. The material forming the substrate (such as an epoxy resin or a glass-epoxy composite) and the solder resist both have poor affinity for solder, and even if heating takes place for a short length of time at a temperature lower than the solidus temperature of the solder alloy while the material is in intimate contact with a solder coating, solid phase diffusion with the solder does not take place. Accordingly, solid phase diffusion bonding of the solder coating selectively takes place between the electrodes of the circuit board and the solder coating.

Then, as shown in FIG. 6(c), the solder transfer sheet 100 is peeled off the circuit board 20. As a result, as shown in FIG. 6(d), the solder coating in the portions which have undergone solid phase diffusion bonding to the electrodes is selectively transferred to the electrodes 24 of the circuit board 20 and forms solder bumps 40, while the solder coating in the portions which contact the remaining portions (non-electrode portions) of the circuit board is separated from the circuit board while remaining adhering to the transfer sheet 100. Since the bonding strength between the electrodes and the solder coating is markedly higher than the adhesion between the non-electrode portions and the solder coating, due to the height difference which is normally present at the border between the electrodes of the circuit board and the non-electrode portions, a type of shearing force acts at the border in the solder coating, the solder coating is severed at the border, the solder coating adheres only atop the electrodes of the circuit board, and the remainder of the solder coating remains on the transfer sheet.

Accordingly, the bonding strength between each layer after solid phase diffusion bonding satisfies the following relationship:

[bonding strength between electrodes and solder coating by solid phase diffusion]>[adhesion between solder coating and adhesive layer]>[bonding strength between non-electrode portions and solder coating].

If the solder coating is replaced by a solder particle layer, the first embodiment also satisfies the above relationship. The same relationship is also satisfied when a metal film is used instead of an adhesive layer.

There is little variation in the height of solder bumps 40 formed atop the electrodes 24 of the circuit board 20, and their height is substantially uniform. The bump height can be controlled by adjusting the thickness of the solder coating 13 of the transfer sheet. The solder bumps 40 which are formed in this manner are flat as shown in the drawings, but by heating the circuit board to a temperature higher than the liquidus temperature of the solder alloy constituting the solder bumps to reflow the bumps, it is possible to form solder bumps having a rounded shape due to surface tension. This causes the central portion of the bumps to be raised so that the height of the solder bumps is increased. In this case as well, if the electrode diameter is uniform, there is little variation in the height of the raised solder bumps.

As shown in FIG. 6(d), with the solder transfer sheet 100 which was peeled off the circuit board 20, the solder coating disappears by severing due to shearing force in the regions 50 opposing the electrodes of the circuit board, and the solder coating 13 remains in the regions 52 opposing the non-electrode portions.

In the case of a circuit board having electrodes which are locally concentrated, the solder coating of the solder transfer sheet can be provided in the shape of a block only in the regions where transfer is necessary (namely, in the regions opposing the electrodes of the circuit board). In this case, an adhesive layer or a metal film which is not readily wet by molten solder and which is provided atop the supporting substrate of the transfer sheet as a lower layer of the solder coating may be provided over the entire surface of the supporting substrate or it may be provided as blocks having the same shape as the solder coating.

In either of the above-described first embodiment and second embodiment of the present invention, it is unnecessary to align or position the electrodes of the circuit board and the transfer sheet, and a solder layer can be selectively transferred just to portions to be soldered of a circuit board with accuracy, and solder bumps can be formed by simply disposing the circuit board and the transfer sheet one on another and heating for a short period of time under pressure to a temperature lower than the solidus temperature of the solder alloy. In addition, the solder bumps which are formed have a sufficient height with little variation.

The height of the solder bumps can be finely controlled by the thickness of the solder layer (by the particle diameter of the solder particles in the first embodiment and by the thickness of the solder coating in the second embodiment). When the electrode pitch of the circuit board is a small value such as at most 50 μm, for example, it is difficult to form solder bumps having a height of greater than 10 μm in the first embodiment. However, in the second embodiment, it is possible to form solder bumps having a height greater than 10 μm. This is because in the first embodiment, there is a limit on the particle diameter of the solder bumps, and due to the presence of gaps between particles, solder bumps which are in the form of particles prior to reflow have a smaller amount of solder compared to solder bumps formed from a solder coating of the same height (thickness).

EXAMPLES

The following examples are for the purpose of illustrating the present invention and are not intended to limit the invention in any way. In the examples, unless otherwise indicated, percent means mass percent.

Example 1

This example illustrates the formation of solder bumps using a solder transfer sheet having a solder layer in the form of a monoparticle layer of solder particles.

A commercially available adhesive sheet (SBHF manufactured by Panac Industries, Inc.) having an adhesive layer with a thickness of 25 μm formed from an acrylic adhesive on one side of a polyester film (polyethylene terephthalate) with a thickness of 50 μm was cut to a size of 100×100 mm and used as a supporting substrate having an adhesive layer. The adhesive strength of the adhesive layer was measured by the 180° peeling adhesive strength measuring method prescribed by JIS Z 0237 and was found to be 7 N for a width of 25 mm.

As shown in FIGS. 1(b) and 1(c), solder particles obtained by classifying spherical powder of an Sn-3.5% Ag eutectic solder alloy (the solidus temperature and liquidus temperature were both 221° C.) to a particle diameter of from 5 μm to 10 μm were adhered to a thickness of one particle on the adhesive layer of the adhesive sheet to prepare a solder transfer sheet. Immediately before this adhesion, the solder particles were immersed for 1 minute in a 5 weight % solution of butanetetracarboxylic acid in isopropyl alcohol and then washed with water and dried so as to remove a surface oxide film before use.

The circuit board which was used to form solder bumps was a glass-epoxy substrate having a thickness of 300 μm and measuring 15 mm×15 mm. This substrate had 3600 electrodes per chip with a pitch of 50 μm. Each electrode had a Cu surface and a diameter of 25 μm. The periphery of the electrodes on the surface of the substrate was surrounded by a solder resist having a height of 15 μm higher than the electrodes.

A solid phase bonding flux which was a solution having a composition of 2% of ethylamine hydrobromide, 5% of a glycerine derivative as a high boiling point solvent, and 93% of isopropyl alcohol was applied to the circuit board by spraying. The applied thickness was approximately 10 μm.

Then, a solder transfer sheet which was cut to the same size as the circuit board was disposed on the circuit board so that its solder particle layer opposed the electrodes of the circuit board, a pressing force of 150 N (0.67 N/mm$^2$) was applied with a press, and the assembly was heated for 60 seconds from the circuit board side using a pulse heater as a heating means at a set temperature of 200° C. After the completion of heating under pressure, the assembly was allowed to cool to room temperature, and then the transfer sheet was peeled by hand from the circuit board. As a result, solder particles were transferred only to the electrodes of the circuit board and formed solder bumps in a particulate form. The solder particles maintained their original spherical shapes, and they had not undergone melting. There was no adhesion of solder particles to the solder resist at all.

Figure 7:
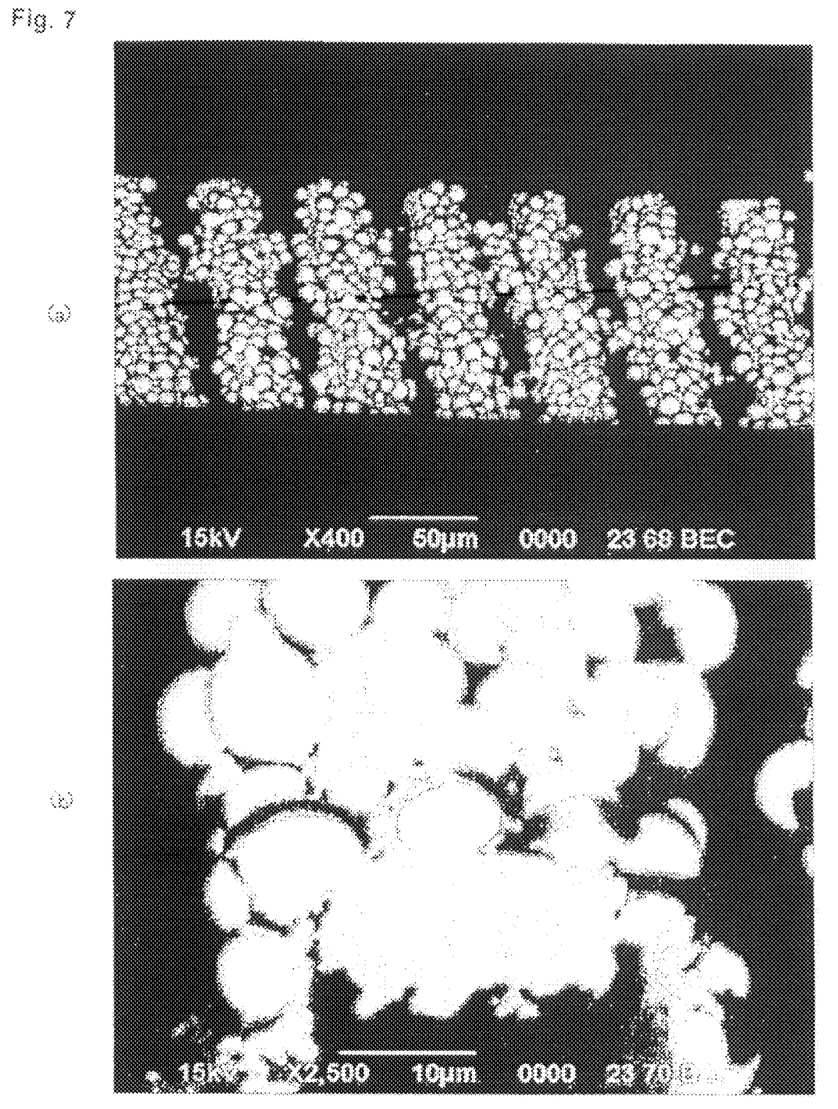
FIGS. 7(a)-7(b) are electron photomicrographs of solder particles transferred by solid phase diffusion bonding to portions to be soldered of a circuit board.

FIG. 7(a) (magnification of 400×) and FIG. 7(b) (magnification of 2500×) show electron photomicrographs of the resulting electrodes (portions to be soldered) of the circuit board. These figures show that solder balls were precisely aligned atop electrodes. A solid phase diffusion layer, namely, an alloyed layer can be seen at the bonding interface.

The solder bumps in the form of solder particles which were formed can be used as is for soldering, or they can be used after the solder particles are melted by reflow heating. In either case, at the time of reflow, the solder particles melt to form a coherent body, and there is no occurrence of bridging even if the electrode pitch is minute.

In this example, a commercially available resin-based flux manufactured by Senju Metal Industry Co., Ltd. (Gammalux 341-30P) was applied as a flux for reflow soldering to a thickness of approximately 20 μm on the solder bumps in the form of particles, and reflow was carried out in a nitrogen atmosphere reflow furnace with a peak heating temperature of 250° C. and a heating time of 10 seconds to melt the solder particles. The flux residue was then removed by washing with an alcohol-based solvent. Upon inspection, it was found that high quality solder bumps of good uniformity in height which was 8 μm with a standard deviation of 0.8 were formed by melting and cohesion, and no bridging was observed.

Example 2

Solder particles were transferred to electrodes of a circuit board in the same manner as described in Example 1 except that a solution consisting of 5% molonic acid tributylamine salt, 3% of polyethylene glycol-nonyl phenol ether as a surface active agent, and 92% of isopropyl alcohol was used as a solid phase bonding flux.

When the heating temperature at the time of transfer was 200° C., a tendency was observed for the transfer density of solder particles to be lower than in Example 1. Therefore, the heating temperature was increased to 210° C. when carrying out transfer of solder particles. In this case, results close to those of Example 1 were obtained.

Comparative Example 1

Solder particles were transferred to the electrodes of a circuit board in the same manner as described in Example 1 except that the heating temperature at the time of transfer was increased to 230° C., which was higher than the liquidus temperature of the solder alloy. After it was confirmed that the solder had solidified, the solder transfer sheet was peeled off the circuit board. As a result, solder bridging occurred on approximately 80% of the electrodes, and solder was also present atop the solder resist of the circuit board.

It was found that the melt transfer method disclosed in Patent Document 2 is inappropriate when the pitch of electrodes on a circuit board is narrow as in this example. There was no great difference in the results even when the solid phase bonding flux was changed to a resin flux having a different composition, and there was much occurrence of bridging. Accordingly, the occurrence of bridging was not due to the difference in the solid phase bonding flux.

Example 3

This example illustrates the formation of solder bumps using the solder transfer sheet shown in FIG. 4 having a solder layer in the form of a continuous solder coating.

The supporting substrate of the transfer sheet was the same as that used in Example 1 which was a commercially available adhesive sheet having an adhesive layer previously formed thereon and which was cut to a size of 100 mm×100 mm. Namely, the entire surface of one side of a polyethylene terephthalate film (thickness of 50 μm) forming the supporting substrate had an adhesive layer with a thickness of 25 μm of an acrylic adhesive.

A solder foil having a thickness of 10 μm which was manufactured by rolling was adhered to the adhesive layer of the supporting substrate to prepare a solder transfer sheet having a solder layer in the form of a continuous solder coating. The solder foil which was used was made from the same Sn-3.5% Ag eutectic solder alloy (solidus temperature and liquidus temperature of 221° C.) as in Example 1.

The circuit board used for forming solder bumps was an interposer board for chip mounting measuring 30 mm×30 mm and having 6400 electrodes with a diameter of 20 μm and a pitch of 40 μm, with each electrode being gold-plated to a thickness of 0.03 μm.

The solder transfer sheet was cut to the same size as the circuit board, and it was treated with the same solution of butanetetracarboxylic acid in alcohol as used in Example 1 to remove the surface oxide film on the solder coating and then washed with water and dried. Immediately thereafter, the transfer sheet and the circuit board were stacked one on another so that the solder coating surface of the transfer sheet opposed the electrode surfaces of the circuit board, and the resulting assembly was heated under pressure with a heating temperature of 210° C. and a pressing force of 200 N (0.22 N/mm$^2$) for 60 seconds. The means for pressing and heating were the same as in Example 1. After cooling, the transfer sheet was peeled off the circuit board by hand.

A flat solder layer with a thickness of approximately 10 μm was precisely transferred to atop the electrodes of the circuit board to form solder bumps. The solder bumps were then reflowed in the following manner.

The same flux for reflow soldering as used in Example 1 was applied to a thickness of approximately 20 μm, and then heating was carried out in reflow furnace of a nitrogen atmosphere with a peak temperature of 250° C. for a heating time of 10 seconds to melt the flat solder bumps. Flux residue was then removed by washing with an alcohol-based cleaning fluid. Upon inspection, it was found that high quality solder bumps of good uniformity in height which was 8 μm with a standard deviation of 0.8 were formed.

The formation of a Sn—Au solid phase diffusion phase and an increase in the bonding strength achieved thereby in this example were confirmed by the fact that selective transfer of the solder layer to electrodes were accomplished precisely. From the results of microscopic observation of the circuit board prior to reflow heating, it was ascertained that the sheared cross section of the solder coating between adjoining electrodes was cleanly exposed. There was no observation of any residual solder coating straddled between adjoining electrodes.

Example 4

In this example, a transfer sheet was one which replaced the adhesive layer in the transfer sheet shown in FIG. 4 with a metal film.

The supporting substrate of this solder transfer sheet was a polyester (polyethylene terephthalate) film with a thickness of 50 μm. An aluminum film having a thickness of less than 1 μm was formed by vapor deposition on one side of this polyester film, and a solder coating with a thickness of approximately 10 μm was formed atop this metal film by electroplating. The solder alloy which was used was the same Sn-3.5% Ag eutectic solder alloy as in Examples 1-3.

Using the solder transfer sheet which was prepared in this manner, solder bumps were formed on the electrodes of a circuit board in the same manner as described in Example 3. The height of the flat solder bumps which were formed on the electrodes was 10 μm, and the height of the solder bumps after reflow heating was 13.5 μm with a standard deviation of 0.8.

Example 5

Solder particles were transferred atop the electrodes of a circuit board in the same manner as described in Example 1 except that the solder particles which were used were obtained by classifying a spherical powder of a Sn-3.5Ag eutectic solder alloy to a particle diameter in the range of 3 μm to 8 μm and that the circuit board which was used was the same as that described in Example 3, and then reflow heating was carried out. Since the electrode surface was made of Au, the application of a solid phase bonding flux was omitted. The solder bumps after reflow had a height of 7 μm with a standard deviation of 0.8.

The invention claimed is:

1. A method of forming solder bumps on portions to be soldered on a first side of a circuit board including the following steps (a)-(c):
    (a) disposing a solder transfer sheet having a solder layer which is adhered to at least one side of a supporting substrate and which has a size sufficient to cover at least two adjoining portions to be soldered so that the solder layer of the transfer sheet opposes the first side of the circuit board, wherein the solder layer is a monoparticle layer which is formed by forming an adhesive layer atop the supporting substrate, dispersing solder particles atop the adhesive layer in an amount greater than an amount necessary to completely cover the adhesive layer with the solder particles and adhering a single layer of the solder particles to the adhesive layer, and removing solder particles not in the single layer,
    (b) heating the circuit board and the opposing transfer sheet under pressure to a temperature lower than the solidus temperature of the solder alloy constituting the solder layer of the transfer sheet to produce solid phase diffusion bonding between the portions to be soldered of the circuit board and the solder layer of the transfer sheet, and
    (c) after step (b), peeling the transfer sheet from the circuit board and leaving portions of the solder layer which opposed the portions to be soldered adhered to the portions to be soldered while leaving other portions of the solder layer adhered to the supporting substrate.

2. A method as claimed in claim 1 wherein the solder layer has a size sufficient to cover all the portions to be soldered of the circuit board.

3. A method as claimed in claim 1 wherein in step (a), a flux is present between the solder layer and the portions to be soldered of the circuit board.

4. A method as claimed in claim 1 wherein the heating temperature in step (b) is at least 5° C. below the solidus temperature of the solder alloy.

5. A method as claimed in claim 1 further including the following step (d) after step (c):
    (d) heating the circuit board obtained in step (c) to a temperature of not lower than the liquidus temperature of the solder alloy to melt the solder layer and then solidifying the solder.

* * * * *